United States Patent
Armstrong

Patent Number: 5,451,903
Date of Patent: Sep. 19, 1995

[54] LOW SUPPLY VOLTAGE OUTPUT DRIVER

[75] Inventor: Desmond R. Armstrong, Hong Kong, Hong Kong

[73] Assignee: Motorola, Inc., Schaumburg, Ill.

[21] Appl. No.: 264,871

[22] Filed: Jun. 24, 1994

[51] Int. Cl.$^6$ .............................................. H03F 3/26
[52] U.S. Cl. ..................................... 330/263; 330/288
[58] Field of Search ................ 330/263, 267, 268, 288, 330/296

[56] References Cited

U.S. PATENT DOCUMENTS 3,938,053  2/1976  Menniti et al. ......................... 330/17
5,311,146  5/1994  Brannon et al. ....................... 330/288

*Primary Examiner*—Steven Mottola
*Attorney, Agent, or Firm*—Harry A. Wolin; Daniel R. Collopy

[57] ABSTRACT

An output driver (100) for driving an external impedance load (160) comprising an output stage (110) and an impedance element (120). An input signal to the output stage (110) is controlled to provide an output signal that then drives the external impedance load (160).

The output stage (110) comprises an input controller (112) that couples to a current generator (114) and a current replicator (116). A voltage reference source (150) determines a quiescent output current level of the current generator (114). The impedance element (120) comprises a current modulating resistor (230) that couples a two polarity voltage supply (130) to the output stage (110).

Operations of the output driver (100) depends on the external load impedance (160). For a high external impedance load, the output driver (100) functions as a simple voltage follower. For a low external impedance load, the output driver (100) functions as a single-ended push-pull circuit and provides a low distortion output signal under low voltage supply conditions.

8 Claims, 2 Drawing Sheets

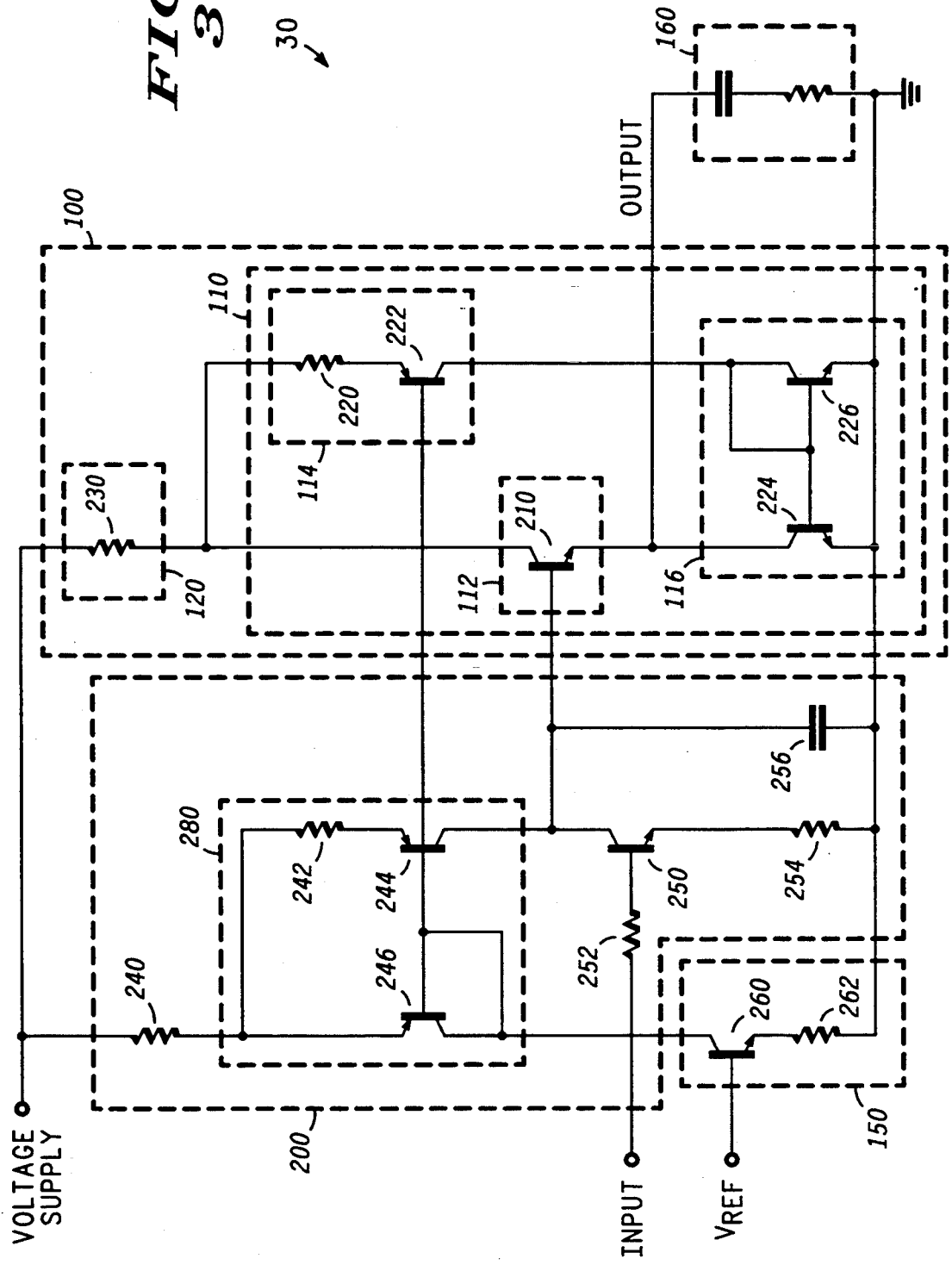

LOW SUPPLY VOLTAGE OUTPUT DRIVER

FIELD OF THE INVENTION

This invention relates in general to electronic circuits, and in particular to output driver circuits.

BACKGROUND OF THE INVENTION

Single-ended push-pull amplifiers serving as output drivers are known in the art. These push-pull amplifiers use both a negative phase and a positive phase of a two phase input signal and, therefore, maximise the usage of available input power from the two phase input signal. Such push-pull amplifiers typically drive loads with varying impedances and therefore should have a low output impedance to minimise the effect on its voltage gain by the impedance of a load.

However, existing push-pull amplifiers do not provide a stable and low distortion drive to a load when powered by a low supply voltage. Using low supply voltages reduces the current consumption of an electronic circuit and thereby is a major consideration in designing electronic circuits used in portable electronic devices. Characteristics of a push-pull amplifier, such as current consumption and output impedance, allow users to apply the push-pull amplifier effectively.

Hence, these problems limit the use of push-pull amplifiers as output drivers in electronic circuits, particularly when the electronic circuits are used in portable electronic devices that rely on batteries for power. Moreover, such an electronic circuit require a stable and low distortion output drive when driving loads with varying impedances.

Therefore a need exists for an output driver to operate at a low supply voltage in order to reduce its current consumption. This need can be addressed when such an output driver operates effectively and efficiently at the low supply voltage. In particular, what is needed is a stable, low distortion output drive from a low supply voltage single-ended push-pull amplifier serving as an output driver.

SUMMARY OF THE INVENTION

In carrying out the objects of the present invention in one form, there is provided an output driver for driving an external impedance load. The output driver comprises an output stage for controlling an input signal to drive the external impedance load, and an impedance element for coupling a voltage supply to the output stage.

BRIEF DESCRIPTION OF THE DRAWING

FIG. 3 is a circuit schematic of an alternate embodiment of the output driver in accordance with the present invention.

DETAILED DESCRIPTION OF THE INVENTION

Figure 1:
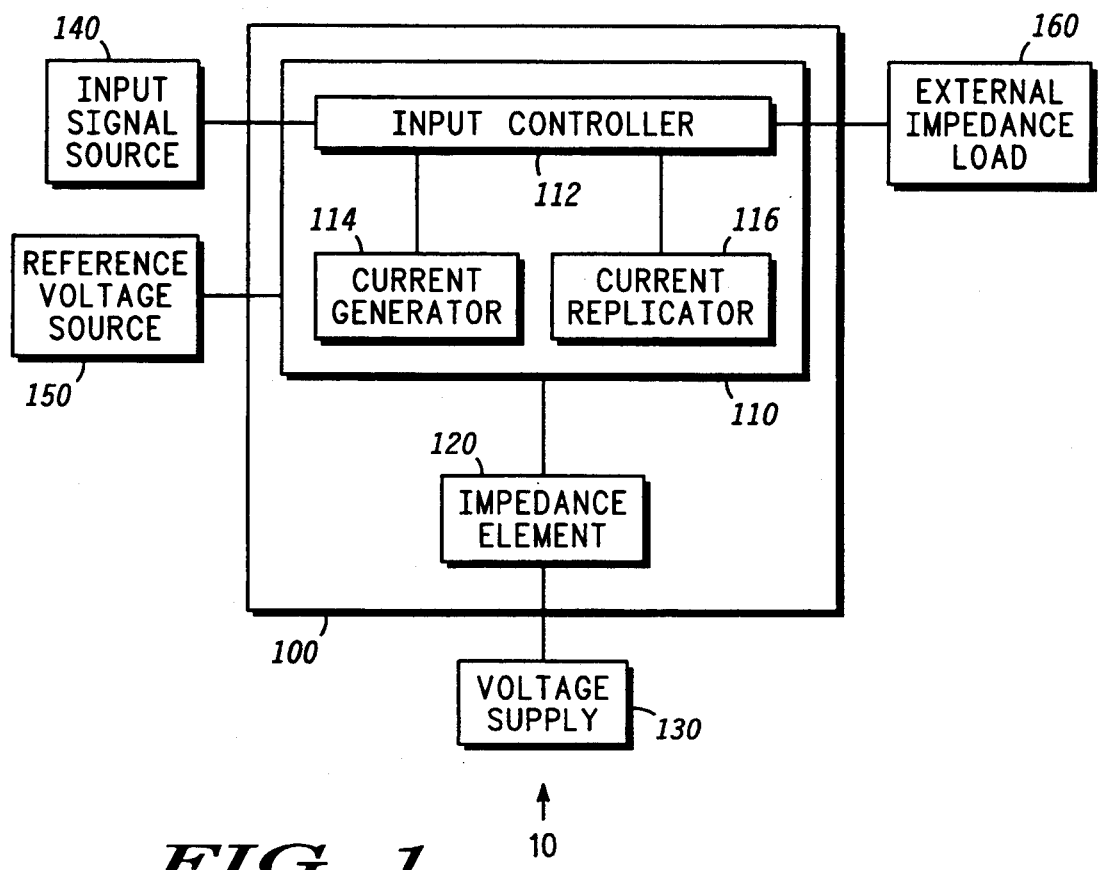
FIG. 1 is a functional block diagram of an output driver in accordance with the present invention.

In accordance with the present invention, a block diagram of an output driver 100 is shown in FIG. 1. The output driver 100 comprises an output stage 110 and an impedance element 120. Power is supplied to the output driver 100 by a voltage supply 130 that couples to the output stage 110 through the impedance element 120.

The output stage 110 comprises an input controller 112 that couples to a current generator 114 and a current replicator 116. The input controller 112 controls an input signal from an input signal source. An output signal from the input controller 112, derived from the input signal, drives an external impedance load 160. FIG. 1 also shows a reference voltage source 150 that couples to the current generator 114 and determines a quiescent output current level of the current generator 114.

Figure 2:
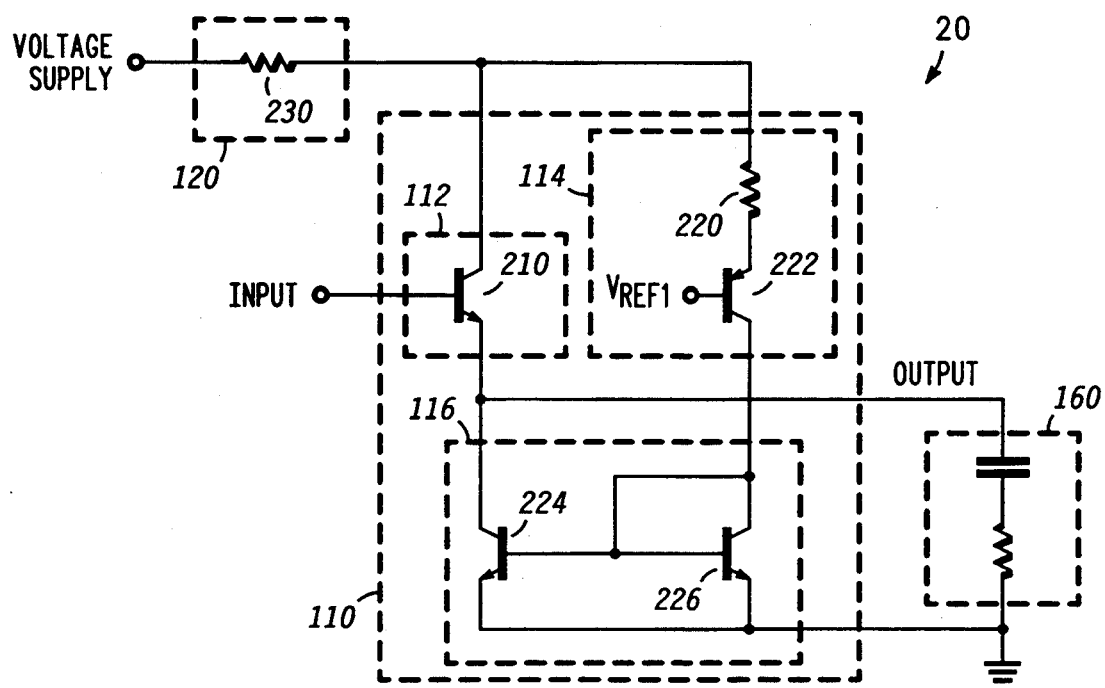
FIG. 2 is a circuit schematic of a preferred embodiment of the output driver in accordance with the present invention.

Implementing the output driver 100 requires a plurality of electronic components such as transistors and resistors. A preferred embodiment in accordance with the present invention is shown in FIG. 2. The impedance element 120 comprises a current modulating resistor 230 that couples to the output stage 110. Within the output stage 110, the input controller 112 comprises a control transistor 210. The control transistor 210 couples to the current generator 114 that comprises a control resistor 220 and a current generating transistor 222. The control transistor 210 also couples to the current replicator 116 that comprises a mirror transistor 224 and a current sinking transistor 226. As is known in the art, the mirror transistor 224 provides a replicated current output at its collector that depends on an area ratio of the emitter junctions of the mirror transistor 224 and the current sinking transistor 226.

Under different external load conditions, the output driver 100 will operate to provide the output signal to the external impedance load 160. For a high external impedance load, the current generator 114 and the current replicator 116 function as a typical constant current generator that supplies a constant quiescent output current to the high external impedance load. However, for a low external impedance load, current in the collector and emitter of the control transistor 210 will vary. Varying this current will also cause the voltage across the current modulating resistor to also vary. Hence, the current modulating resistor 230 affects a quiescent output current level of the current generating transistor 222 that in turn modulates the current supply to the current replicator 116.

FIG. 3 shows an alternate embodiment 30 of the output driver 100 in accordance with the present invention. In FIG. 3, a plurality of circuits, including a signal amplifier 200 and the reference voltage source 150, couples to the output driver 100. The signal amplifier 200 comprises an amplifying transistor 250, an input coupling resistor 252, an emitter resistor 254, and a current source 280 having two transistors 244, 246 and a current source bias resistor 242. The input signal couples through the input coupling resistor 252 to the base of the amplifying transistor 250. This input signal can be either a single phase signal or a two phase signal. A two phase signal, such as an intermediate frequency signal that is down-converted from a frequency modulated radio carrier signal, typically comprises a positive phase signal and a negative phase signal. The reference voltage source 150 comprises a buffer transistor 260 and an emitter bias resistor 262. A voltage reference input couples into the base of the buffer transistor 260 that provides a bias rail for the current source 280 and the current generator 114. This alternate embodiment 30 can be incorporated, for example, in an integrated circuit whereby the output driver 100, along with the signal amplifier and the reference voltage source 150, is fabricated on a silicon wafer.

Existing single-ended push-pull output drivers typically operate at voltage supplies of between four to ten volts. However, existing single-ended push-pull output drivers cannot provide a low distortion output signal with lower voltage supplies. Hence, the novel use of the current modulating resistor 230 enables the output driver 100 to effectively operate, not only at the typical voltage supplies of between four to ten volts, but also at lower voltage supplies of between two to four volts.

By now it should be appreciated that there has been provided an output driver 100 that operates with a low supply voltage and yet provides a stable, low distortion output drive to an external impedance load 160. Such an output driver 100 reduces the current consumption of battery-powered electronic devices because of the low supply voltage used, and therefore prolongs the operating duration of such battery-powered electronic devices.

We claim:

1. An output driver, powered by a voltage supply having a first polarity and a second polarity, for driving an external impedance load and having an output stage for controlling an input signal wherein the output stage includes an input controller, a current generator, and a current replicator and further wherein the input controller couples to the current generator and the current replicator to control the input signal to provide an output signal to the external impedance load and further additionally wherein the current generator couples to a reference voltage source for determining a quiescent output current level of the current generator, the output driver comprising:

an impedance element having a first node coupled to the first polarity of the voltage supply and a second node connected to a node common to both the current generator and the input controller.

2. The output driver of claim 1 wherein the impedance element comprises a current modulating resistor.

3. The output driver of claim 1 wherein the voltage supply is between and including one to four volts.

4. An output driver circuit having a plurality of circuit stages including an output stage for controlling an input signal to drive an external impedance load wherein the output stage includes an input controller, a current generator, and a current replicator, and further wherein the input controller couples to the current generator and the current replicator to control the input signal to provide an output signal to the external impedance load and further additionally wherein the current generator couples to a reference voltage source for determining a quiescent output current level of the current generator, the output driver circuit comprising:

an impedance element having a first node coupled to a first polarity of a voltage supply and a second node connected to a node common to both the current generator and the input controller.

5. The output driver of claim 4 wherein the impedance element comprises a current modulating resistor.

6. The output driver circuit of claim 4 wherein the voltage supply is between and including one to four volts.

7. An output driver circuit having a single-ended push-pull amplifier for controlling an input signal to drive an external low impedance load and wherein a voltage supply between and including one to four volts provides power to the output driver and further wherein the single-ended push-pull amplifier includes a current generator and an input controller and further additionally wherein the current generator couples to a reference voltage source for determining a quiescent output current level of the current generator, the output driver comprising:

an impedance element having a first node coupled to a first polarity of the voltage supply and a second node connected to a node common to both the current generator and the input controller of the single-ended push-pull amplifier.

8. The output driver of claim 7 wherein the impedance element comprises a current modulating resistor.

* * * * *